United States Patent [19]

Singer et al.

[11] Patent Number: 4,625,332

[45] Date of Patent: Nov. 25, 1986

[54] PROGRAMMABLE TIME VARYING ATTENUATOR

[75] Inventors: Paul A. Singer, Santee; James L. Conrath, San Diego, both of Calif.

[73] Assignee: The United States of America as represented by the Secretary of the Navy, Washington, D.C.

[21] Appl. No.: 718,259

[22] Filed: Apr. 1, 1985

[51] Int. Cl.⁴ ............................................. H04B 17/00
[52] U.S. Cl. ..................................... 455/67; 371/22; 371/27; 455/226
[58] Field of Search .................... 455/226, 67, 249; 375/10; 364/578, 553, 581; 371/22, 23, 27

[56] References Cited

U.S. PATENT DOCUMENTS

| | | | |
|---|---|---|---|
| 3,496,536 | 2/1970 | Wheeler et al. | 371/22 |
| 3,694,643 | 9/1972 | Smith | 364/553 |
| 3,842,247 | 10/1974 | Anderson | 364/481 |
| 4,005,366 | 1/1977 | Poirier et al. | 455/226 |
| 4,074,201 | 2/1978 | Lennon | 455/226 |
| 4,191,995 | 3/1980 | Farrow | 364/182 |
| 4,322,857 | 3/1982 | Grohmann et al. | 455/226 |
| 4,412,348 | 10/1983 | Sutphin, Jr. | 455/67 |
| 4,445,221 | 4/1984 | Reynolds et al. | 371/22 |
| 4,468,607 | 8/1984 | Tanaka et al. | 455/249 |

Primary Examiner—Marc E. Bookbinder
Attorney, Agent, or Firm—Robert F. Beers; Ervin F. Johnston; Thomas G. Keough

[57] ABSTRACT

A programmable time varying attenuator has a reprogrammable digital circuit for impressing an analog attenuation signal on a continuous wave noise signal. This signal is fed to the input of a receiver and since the digital circuitry can be reprogrammed with a known sequence to effect a desired analog attenuation, a receiver's performance can be monitored and evaluated when the attenuated signal or error signal is simultaneously received with information signals. A desired time relationship between the information signals and the time varying attenuating test signal or error signal is maintained since both are slaved to a common standard. The programmable time varying attenuator is programmable independent of the information signal source and, therefore, is adaptable with different sources while being a highly reliable and cost effect device for system testing.

3 Claims, 2 Drawing Figures

PROGRAMMABLE TIME VARYING ATTENUATOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

A wide variety of testing apparatuses for communications systems have evolved along with the communicating systems they serve. Generally speaking as the complexities of the systems increase, the methods and devices for determining proper systems operation also grow in complexity.

Typical of a system and method for monitoring the performances of a channel is shown in U.S. Pat. No. 3,694,643. Pseudorandom noise sequence generators are fabricated to provide signals transmitted simultaneously with a data signal to determine the cross-correlation between the data signal and the generator signal. While a great deal of detail is not stated regarding the pseudorandom noise sources, it appears that they are fixed and not reprogrammable and may be of a somewhat high degree of complexity. The apparatus and method for measuring envelope delay of U.S. Pat. No. 3,842,247 has a computer generating signals for controlling the signal generator for adjusting loss in a reference pass to equal the loss experienced by a signal propagating through the facility under test at the frequency of interest. The simulation of the loss by the general purpose computer appears to be effective for the specific application disclosed and apparently does not require a single common time base with the information flow of the information signal. U.S. Pat. No. 4,074,201 has an analyzer and noise estimation relying upon a reference source amplifier and comparator for producing a reference signal for comparison with an input signal. The method and circuit arrangement of U.S. Pat. No. 4,322,857 has a test pulse generator driving a broadband noise generator that feeds the test signal at the input of the high frequency stage of a radio receiver. Only the general broad function that a pulse sequence is generated is disclosed. The details of the test pulse generator are not elaborated on. The apparatus of U.S. Pat. No. 4,412,348 shows a test equipment to determine the linearity of an FM transmitter and relies upon a single amplitude modulation generator signal source that produces an amplitude modulated signal of known varying amplitudes.

Some of the highly sophisticated data processing techniques for the more sophisticated information content need more to be validated and verified to provide meaningful information regarding the systems's readiness. Finely tuned signal discrimination, error checking and spurious signal detection capabilities must be routinely checked and validated. Part of this validation process should have the detection and identification of error signals, as opposed to information signals, so that they can properly be compensated for and discarded. Error signals of the type likely to influence some sophisticated signals might require a complicated test device and, as such, may be unduly costly and of doubtful long term reliability due to their complexity.

Thus, there exists in the state of the art a continuing need for a validation testing device which generates erroneous data within the envelope of an expected information signal that is precisely determinable and readily reprogrammable to provide operators and technicians an indication of the current operational status of complex communications systems.

SUMMARY OF THE INVENTION

The present invention is directed to providing an apparatus for injecting an automatic time varying attenuated test signal mixed in with an information signal from an information source that is fed to a radio receiver to initiate testing. A signal generator provides a continuous wave noise signal of the same frequency or slightly removed from the carrier frequency of the information source. An EPROM and operatively associated counter memory and latch circuit generate a digital reprogrammable time varying attenuation error signal that is coupled to an attenuation circuit. The attenuation circuit has the capability for impressing the desired error attenuation signal on the continuous wave noise signal. The digital reprogrammable signal effects the proper attenuation in a repeatable identifiable manner at precise times. The inherent uncomplicated reliable circuitry for generating the digital reprogrammable attenuation error signal assures high system reliability at a greatly reduced cost.

The prime object of the invention is to provide a test signal for a communications system that simulates an error signal.

Another object is to provide an error signal simulator that generates a signal centered on or near an information signal to test the operability of a receiving terminal.

Still another object of the invention is to provide a readily reprogrammable digital control for producing varying attenuation signals representative of error signals for a receiving terminal.

Yet a further object is to provide a programmable read-only memory and its associated digital circuit components for initiating a time varying attenuation signal that is precise and stable for generating a known error signal.

Still another object is to provide an EPROM and associated digital circuitry having a high degree of reliability and cost effectiveness to generate a recurring time variable error attenuation system for the testing of a receiver terminal.

These and other objects of the invention will become more readily apparent from the ensuing specification when taken in conjunction with the claims and the appended drawings.

DESCRIPTION OF THE PREFERRED EMBODIMENT

Figure 1:
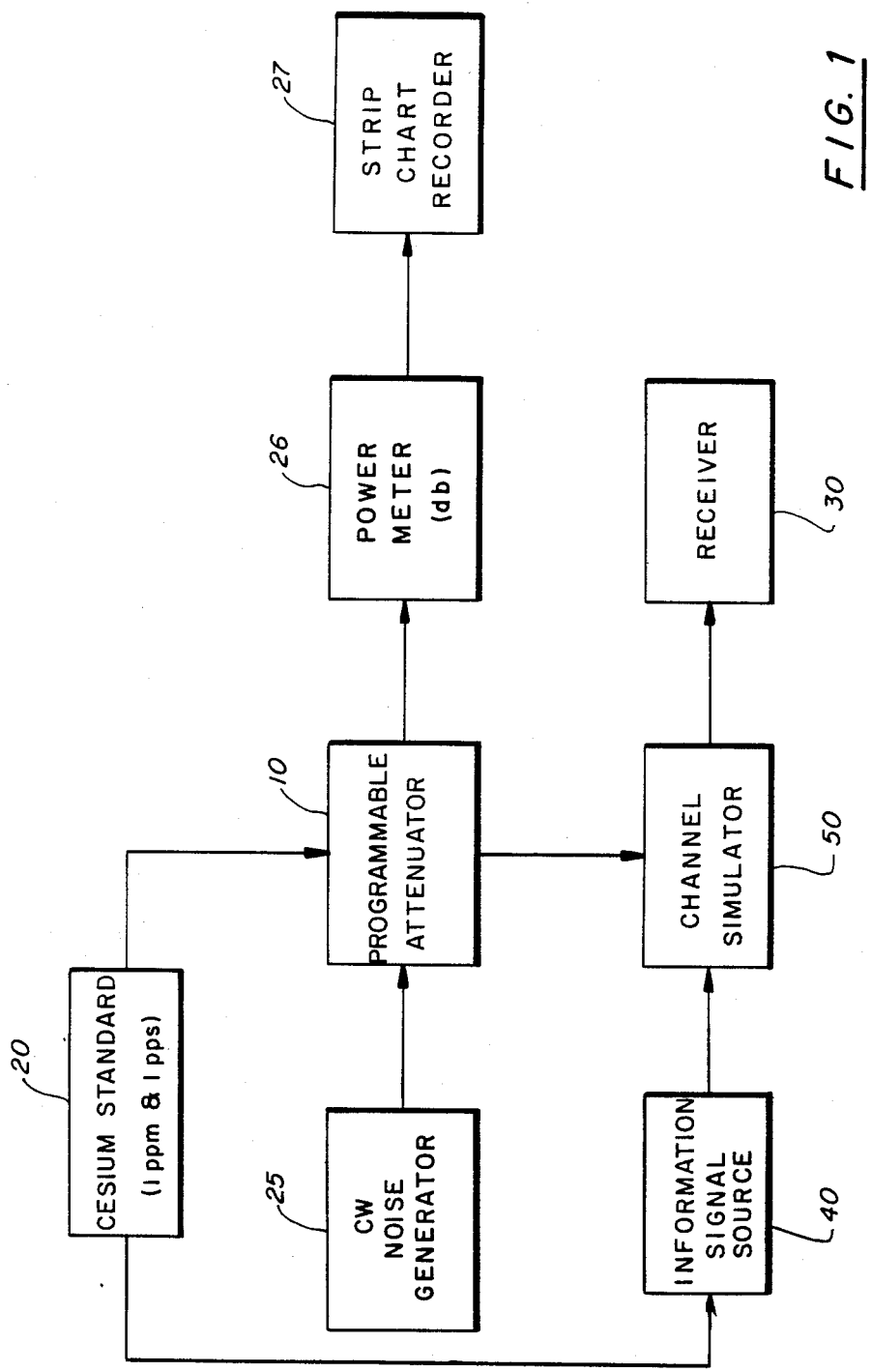
FIG. 1 shows a block diagram form of the invention operatively associated within a system for testing a receiving terminal.

Referring now to FIG. 1, the programmable time varying attenuator 10 has been specifically designed to provide an operator or technician with the capability for injecting an automatic time varying error signal into a receiver 30. A typical receiver is one which is part of the network of the minimum essential emergency communications network message processing mode test bed. Without going into needless detail regarding its makeup, the network functions to provide certain communications of a specific nature that require receivers that determine the precise discrimination and analysis of the information content of the information signals. It has been found necessary to provide a means for determining the proper functioning of the receiving equipment to the receipt of error information signals that occur in or very close in frequency to the information signal.

The particular receiver undergoing testing is one which receives a locally generated information signal from a source 40 that is simultaneously received and processed with the automatic time varying attenuation error signal that comes from programmable attenuator 10. The information signal source and the programmable attenuator are both slaved to a common Cesium standard 20 to assure proper phase relationships and both feed their respective signals to a channel simulator 50 before they reach the receiver being tested.

Information signal source 40 is any of an established design that generates an appropriately modulated RF information signal, for example a carrier signal that is phase modulated with a digital information signal. The exact makeup of the signal simulator is not critical to a thorough understanding of this invention except that it should be slaved by timing standard 20 that is also connected to the attenuator 10.

In this case the timing source is a Cesium standard capable of providing pulse sequences at precise rates to assure the proper mixing of the error signal with the information signal. These are received by the programmable attenuator to generate the digital error attenuation signals in a manner to be elaborated on below.

Channel simulator 50 functions to condition both the information signals from source 40 and the error attenuation signals from programmable attenuator 10 as they would appear from the atmospheric transmission channel. That is to say, certain characteristics are imbued on signals as these travel through the atmosphere and these have been impressed upon both signals to make them more realistic in appearance when they are presented to receiver 30 under test. The exact makeup of the channel simulator is not overly critical to a full understanding of this inventive concept. However, its inclusion in this description is hoped to enable a more thorough understanding of the invention's salient features when considered in conjunction with the highly sophisticated system undergoing tests.

A selected channel simulator was manufactured by Collins Radio Co. of Cedar Rapids, Iowa and it simulates the air transmission channel, the transmitting medium, and is passive. It is an impedance matching linear mixing device and includes isolation transformers, adjustable attenuators and resistive summing networks where the signals are mixed.

A continuous wave noise generator 25 is coupled to provide a steady CW signal to the attenuator 10 and is offset from the carrier frequency of the information signal source by about 0.1 Hz to allow for averaging of phase differences between the information signal and the continuous wave to assure better response of the unit under test.

The output signals from programmable time varying attenuator 10 are fed not only to channel simulator 50 but also to a power meter 26 that is coupled to an interconnected strip chart recorder 27. The meter and recorder provide a visual indication of signal levels and characteristics that are being generated by programmable attenuator 10 as well as to give a record for further uses.

Figure 2:
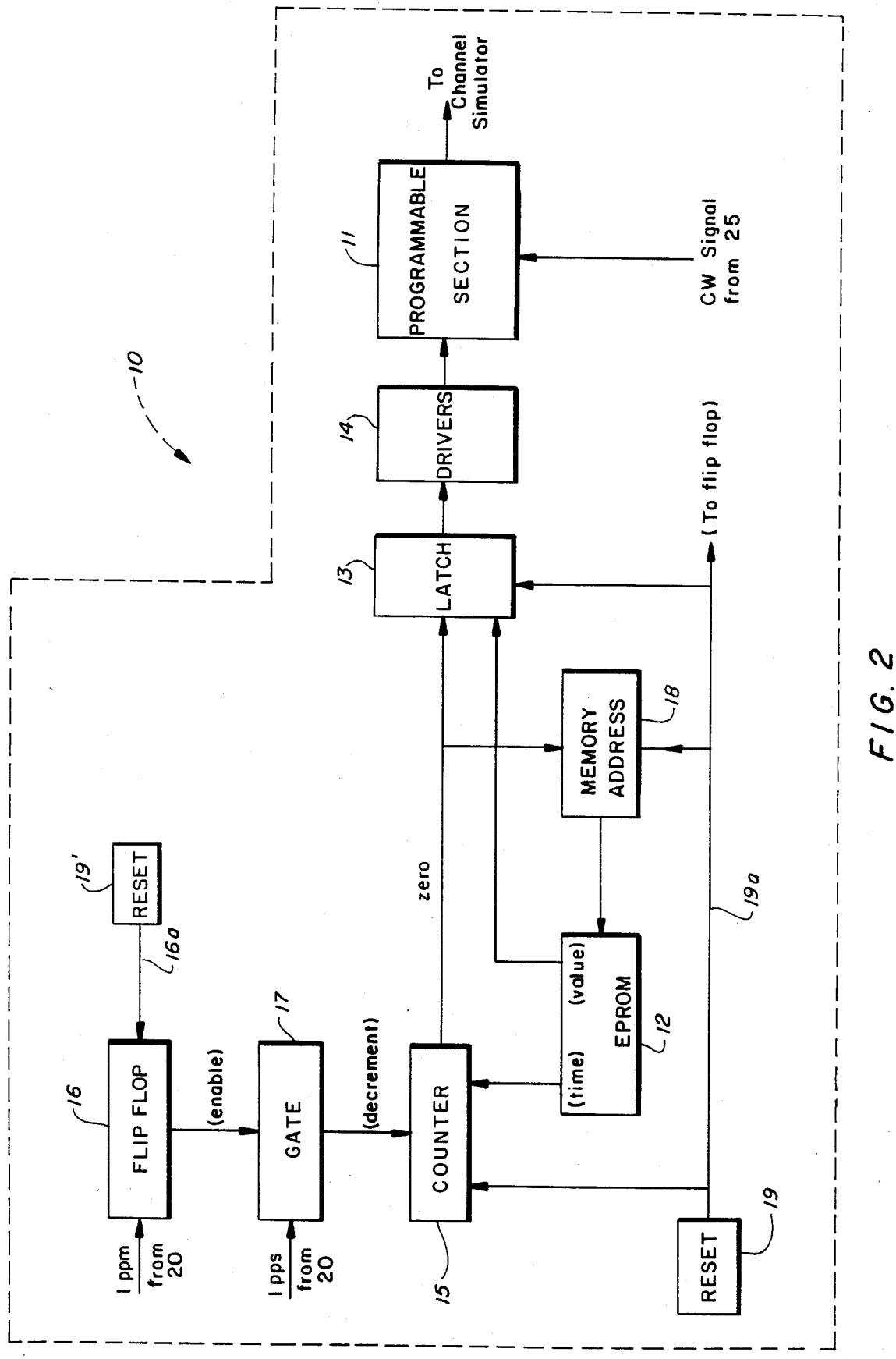
FIG. 2 is a schematic representation of the invention with the integrated circuit components showing connections depicting the signal flow and the generation of the error analog signal for testing of the receiver.

Referring now to the circuit diagram of FIG. 2, the programmable attenuator 10 includes an attenuator section 11 that modulates the CW signal coming from CW noise generator 25. The attenuator section is a commercially available unit for creating an amplitude modulated signal. One which has functioned satisfactorily for this intended useage is the model PA51 Programmable Attenuator marketed by Texcan Corp. of Phoenix, Arz. The attenuator provides an amplitude modulation in accordance with a digital attenuating signal.

The attenuating signal is a time varying programmable error signal which comes from the program stored in an EPROM 12. The EPROM is a standard integrated circuit, for example, a 2732, and is ultraviolet eraseable and electrically programmable to provide a desired digital pulse sequence. This digital pulse sequence is fed to a latch circuit 13 and onto a driver circuit 14. An operatively connected counter 15 also is coupled to the EPROM and the latch circuit. The memory address counter 18, time sequence counter 15, and the flip-flop 16 are coupled to receive an operator controlled reset 19.

The programmable element 11 is driven by latches 13 and the drivers 14 assuming new values come from EPROM 12 at predetermined times. Time increment values are entered into counter 15 and are counted down to zero value in the down count mode by one pulse per second increments from standard 20.

The circuit elements of programmable attenuator 10 are commercially available and connected in accordance with established techniques. The latch circuit 13 could include a suitably connected 74LS375, the driver circuit 14 suitably connected 7407, the counter circuit 15 a 74LS193, the memory address counter 18 a 74LS 193, the flip flop 16 a 74LS74, gate 17 a 74LS00, and the reset a 746S123.

A manually operated reset switch 19 provides a reset pulse at bus 19a to clear programmable attenuator 10 to an initial state. The same reset switch schemtically shown as 19' in FIG. 2 also changes flip-flop 16 at 16a to a state which, upon receipt of a one pulse per minute input from the Cesium standard 20, provides an enabling output which is fed to gate 17. The output of the flip flop acts as an enabling input to gate 17 to allow the one pulse per second input coming from the Cesium standard to decrement the interconnected counter 15.

An initial state reset signal on bus 19a from manually operated reset switch 19 is also coupled to clear memory address counter 18. This same manually operated reset pulse causes the time value as selected by memory address counter 18 stored in EPROM 12 to be put in counter 15 and the attenuation value to be loaded into latch 13. The output of latch 13 is supplied to drivers 14 which in turn feed programmable element 11.

In normal operation Cesium standard 20 slaves both the information source and programmable attenuator 10 such that when the manually operated reset 19 is initiated, counter 15 counts down as a result of the decrement pulses fed to it via gate 17. The zero output of counter 15 increments memory address counter 18 a predetermined amount, the new memory address (data is stored in sequential locations) is provided to EPROM 12 and new values are provided to counter 15 from the EPROM as well as to latch 13. The zero output fed from counter 15 to latch 13 also enables the loading of latch 13 to receive the next time increment value from EPROM 12 into drivers 14.

The error signal generated by the programmable attenuator 10 continues until the EPROM finishes delivering its preprogrammed digital pulse train to attenuator element 11 at which time and in accordance with the program, the entire sequence can be repeated or shut off. The error rate signal is easily modified by simply erasing the EPROM and reprogramming it with another signal. Since the information signal source and the programmable attenuator are both slaved to the common Cesium standard 20, the precise moment of initiation as well as termination is known so that the monitoring of receiver performance can proceed.

The unit used to provide the data rate error signal can be completely removed from one test bed to another. Since digitally actuated integrated circuit components are selected, cost as well as reliability are attractive for the designer.

Obviously, many modifications and variations of the present invention are possible in the light of the above teachings. It is therefore to be understood that within the scope of the appended claims the invention may be practiced otherwise than as specifically described.

We claim:

1. An apparatus for injecting an automatic time varying attenuated test signal mixed in with an information signal from an information source that is fed to a radio receiver comprising:

means for providing a simulated radio signal of constant amplitude;

means for generating digital programmable time varying attenuation control signals including an EPROM and operatively associated counter that provide programmable digital signals;

means coupled to the constant amplitude simulated radio signal providing means and the digital programmable time varying attenuating control signal generating means for attenuating the constant amplitude simulated radio signal with digital programmable time varying attenuating control signals to provide the automatic varying attenuated test signal; and a clock source coupled to the information source and to the digital programmable time varying attenuation control signal generating means to provide common timing control thereof, the digital programmable time varying attenuation control signal generating means includes a memory address circuit coupled to the EPROM and a latch circuit coupled to receive an outputted programmable digital sequence from the EPROM, the clock source being operatively coupled to the counter, and the counter being operatively coupled to the EPROM, the memory address circuit and the latch circuit to assure a desired time relationship thereof with the information signal.

2. An apparatus according to claim 1 in which the latch circuit is operatively coupled to the counter and EPROM to load the latch circuit when a predetermined number of pulses is received by the counter.

3. An apparatus according to claim 2 in which the digital programmable time varying attenuation control signal generating means includes a flip-flop feeding a gate connected to the counter to assure a decrementing of the counter to enable the loading of the latch from the EPROM and a driver coupled to receive an output from the latch to actuate the attenuating means to provide a responsive analog test signal.

* * * * *